July 26, 1955 G. S. DZWONS 2,714,137
STABILIZED AMPLIFIER
Filed Oct. 12, 1944
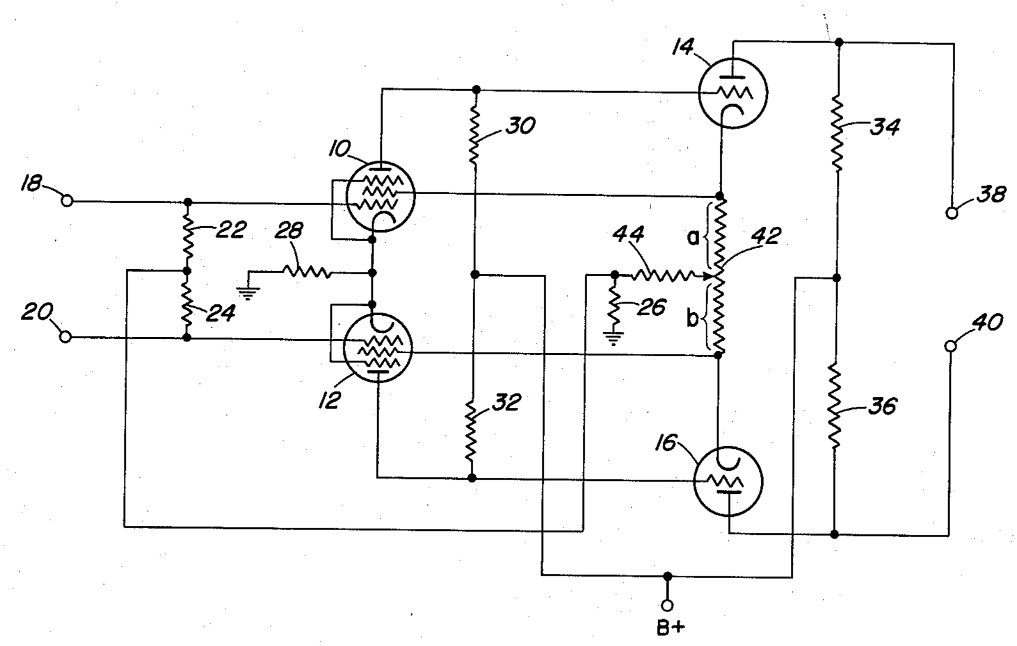
INVENTOR
GEORGE S. DZWONS
BY
ATTORNEYS

United States Patent Office 2,714,137

Patented July 26, 1955

2,714,137

STABILIZED AMPLIFIER

George S. Dzwons, Tulsa, Okla., assignor to the United States of America as represented by the Secretary of the Navy Application October 12, 1944, Serial No. 558,413

3 Claims. (Cl. 179—171)

This invention relates to stabilized amplifiers, and more particularly to stabilized direct-coupled amplifiers.

Stable direct-coupled amplifiers are very difficult to construct and operate, due to the fact that variations of supply voltages have a direct effect on the absolute magnitude of the output signal. Push-pull direct-coupled amplifiers are sometimes used partially to eliminate such sensitivity to supply voltage variations by balancing out changes in electrode potentials. The output of a push-pull direct-coupled amplifier is the difference between the plate voltages of the two vacuum tubes forming the output stage. Thus, if unbalances exist between the two sides of the amplifier, spurious output signals may occur, depending upon the sense in which such unbalances cause the plate voltages of the vacuum tubes of the output stage to vary. Relatively small differences in characteristics of two vacuum tubes of the same type in a push-pull stage caused, for example, by slight differences in emission, may result in serious unbalance in the output of the stage and hence in unsatisfactory operation.

In the past, various systems have been proposed for stabilizing push-pull direct-coupled amplifiers through the use of feedback arrangements. Such arrangements are a successful means for eliminating unbalances, but do not prevent drift or change in gain of the input stage and thus of the complete amplifier. Thus, any condition which causes equal changes in the two sides of the input stage of such an amplifier will alter the gain of that stage, and may result in the operation of a subsequent stage under conditions which do not correspond to the desired operating conditions for that stage. Operation of the vacuum tubes of a stage off characteristic causes distortions, overall changes of gain of the amplifier and, under certain conditions, spurious output signals.

It is an object of the present invention to provide a stabilized direct-coupled amplifier having a balanced output and a substantially constant overall gain.

Accordingly, there is proposed a push-pull direct-coupled amplifier having an input stage and an output stage, feedback connections between the output and input stages in each side of the amplifier for maintaining a balanced output, and a separate feedback connection between the output and input stages to maintain the gain of the input stage at a desired value.

For a better understanding of the invention, reference is made to the accompanying drawing, which is a schematic diagram of a direct-coupled amplifier in accordance with the invention.

In the amplifier of the invention, there is provided an input stage comprising pentode-type vacuum tubes 10 and 12, and an output stage comprising vacuum tubes 14 and 16. The vacuum tubes forming the input stage are connected in a conventional push-pull arrangement. Input signals applied to input terminals 18 and 20 appear across control-grid resistors 22 and 24, connected respectively between the control grids of vacuum tubes 10 and 12, and the ungrounded end of resistor 26. The cathodes of vacuum tubes 10 and 12 are connected to ground through a common cathode resistor 28, and the suppressor grids of the two vacuum tubes are connected to the cathodes of the respective vacuum tubes in the usual fashion. Positive potential from a source indicated at B+ is applied to the plates of the tubes through load resistors 30 and 32. The connections to the screen grids of the vacuum tubes of the first stage form a part of the stabilization system and will be described below.

The output signals of vacuum tubes 10 and 12, appearing respectively across load resistors 30 and 32, are applied to the grids of vacuum tubes 14 and 16. The plates of these vacuum tubes are respectively connected through load resistors 34 and 36 to the source of positive potential at B+. The plates of these vacuum tubes are also connected respectively to output terminals 38 and 40, providing a push-pull output. The winding of a potentiometer 42 is connected between the cathodes of vacuum tubes 14 and 16, and the sliding contactor of this potentiometer is connected through resistors 44 and 26 in series to ground.

The cathode of vacuum tube 14 is connected directly to the screen grid of vacuum tube 10, while the cathode of vacuum tube 16 is similarly connected to the screen grid of vacuum tube 12. The voltages developed across portions *"a"* and *"b"* of the potentiometer winding, each portion in conjunction with resistors 44 and 26, are thus applied in inverse feedback relationship to the screen grids of vacuum tubes 10 and 12, respectively.

In addition, a voltage derived from the voltage divider comprising resistors 44 and 26 is applied in an inverse feedback arrangement to the control grids of vacuum tubes 10 and 12 through resistors 22 and 24, respectively. This feedback voltage is proportional to the total plate current of the vacuum tubes forming the output stage, and it is applied equally to the two sides of the input stage.

Considering the operation of the amplifier, it will be seen that any unbalancing influence which tends to cause the voltage applied to the control grids of vacuum tubes 14 and 16 to be unequal is compensated by inverse feedback provided by the connections in each side of the amplifier between the cathode of the output tube and the screen grid of the input tube. Thus, for example, if the voltage applied to the grid of vacuum tube 14 is raised in respect to that applied to vacuum tube 16, greater instantaneous plate current will flow in vacuum tube 14. Because series resistors 44 and 26 are common to the cathodes of both vacuum tubes 14 and 16, the voltage developed across the portion *"a"* of the winding of potentiometer 42 will increase while that developed across portion *"b"* of the same winding will decrease. These voltages, as fed back respectively to the screen grids of vacuum tubes 10 and 12, tend to increase the plate current of vacuum tube 10 and decrease that of vacuum tube 12. Such changes in the operation of vacuum tubes 10 and 12 cause a decrease in the voltage applied to the grid of vacuum tube 14 and an increase in that applied to the grid of vacuum tube 16, these changes tending to restore the amplifier to balance. Balance, as initially determined in the absence of applied signal by adjustment of potentiometer 42, may, therefore, be maintained. Since actual input signals also represent an unbalance, they are somewhat attenuated by the feedback system, but amplification may be such that this attenuation is not objectionable.

If equal drifts or other changes occur in the vacuum tubes of the first stage, the feedback system for maintaining balance will have no effect. However, distortion and change of gain due to operation of the output stage off characteristic is avoided by the feedback system between the junction of resistors 44 and 26, and the junction of resistors 22 and 24. Equal increases in the grid potentials of vacuum tubes 14 and 16, due to decreases in the plate currents of vacuum tubes 10 and 12, cause the development of an increased voltage across voltage-divider resistor 26. Application of this increased voltage to the control grids of vacuum tubes 10 and 12 tends to increase the plate current thereof, decreasing the voltages applied to the grids of vacuum tubes 14 and 16.

What is claimed is:

1. In a D. C. amplifier circuit, a first pair of amplifying tubes including screen grids, said first pair of tubes including a grid cathode circuit and being connected in push-pull circuit arrangement, means for applying a signal potential to the grids of said first pair of amplifying tubes, a second pair of tubes, means for connecting the plates of said first pair of tubes with the grids of said second pair of tubes respectively, a potentiometer comprising a resistance element disposed between the cathodes of said second pair of tubes and a sliding contactor, a voltage divider disposed between said contactor and ground, means connecting the ends of said potentiometer resistance element with the screen grids of said first pair of tubes in feedback relation, and means connecting a point on said voltage divider to a point removed from ground and common to the grid-cathode circuit of said first pair of tubes whereby negative feedback is provided from the second pair of tubes to the first pair of tubes, the adjustment of said potentiometer maintaining circuit balance.

2. In a D. C. amplifier circuit, a first pair of amplifying tubes including screen grids, a second pair of amplifying tubes connected in a closed circuit with said first pair of tubes, each pair of said tubes being connected in push-pull arrangement, means for applying a signal potential to the grids of said first pair of amplifying tubes, means for taking off an amplified signal potential from the plates of said second pair of amplifying tubes, the plates of said first pair of tubes being connected respectively to the grids of the said second pair of tubes, a potentiometer having a sliding contactor and a resistance element, said resistance having its ends connected respectively to the cathodes of the second stage tubes and also to the screen grids of the first stage tubes, a second resistance element connected to said sliding contactor and to ground to constitute a common cathode path for the second stage tubes whereby movement of the contactor balances the two sides of the push-pull circuit, a common cathode resistor for the tubes in the first stage, and a feedback connection from a point on said second resistance element to the input circuit of the first stage to provide a feedback component common to both sides of the push-pull path and selected to compensate for drifts or other changes affecting both sides.

3. A stabilized amplifier comprising a first pair of amplifier tubes, a second pair of amplifier tubes, each pair of said tubes being connected in push-pull arrangement, each of said tubes having a cathode, an anode and a control electrode, each of the tubes of the first pair having a screen electrode, a common cathode resistor for said first pair of tubes disposed between thir cathodes and ground, a first and a second a grid resistor connected together on one end and having their other ends respectively connected to the control electrodes of said first pair of tubes, signal input means disposed between the control electrodes of said first pair of tubes, the anodes of said first pair of tubes being connected to the control electrodes of said second pair of tubes respectively, output means disposed between the anodes of said second pair of tubes, a potentiometer having a sliding contactor and a winding, said winding being disposed between the cathodes of said second pair of tubes, a voltage divider comprising a first voltage divider resistor and a second voltage divider resistor connected to each other at one end, said first voltage divider resistor being connected at its other end to the contactor, said second voltage divider resistor being grounded at its other end, the junction of the voltage divider resistors being connected to the junction of the grid resistors, the cathodes of said second pair of tubes being connected to the screen grids of said first pair of tubes, the sliding contactor being disposed along the winding, voltages developed in the windings between the contactor and the respective cathodes of the second pair of tubes in conjunction with voltages developed across the voltage divider resistors thereby being applied in inverse feedback relationship to the screen grids of said first pair of tubes, and voltage derived from the voltage divider thereby being applied in inverse feedback arrangement to the control electrodes of said first pair of tubes, thus compensating for unbalancing influence and avoiding distortion and change of gain due to operation of the output stage off characteristic.

References Cited in the file of this patent

UNITED STATES PATENTS

| | | |
|---|---|---|
| 1,948,977 | Aiken | Feb. 27, 1934 |
| 2,070,071 | Stromeyer | Feb. 9, 1937 |
| 2,190,743 | Vance | Feb. 20, 1940 |
| 2,226,238 | Doba | Dec. 24, 1940 |
| 2,240,286 | Cousins | Apr. 29, 1941 |
| 2,240,635 | Avins | May 6, 1941 |
| 2,270,295 | Harley | Jan. 20, 1942 |
| 2,361,198 | Harmon et al. | Oct. 24, 1944 |
| 2,370,483 | Muffly | Feb. 27, 1945 |

FOREIGN PATENTS

| | | |
|---|---|---|
| 537,300 | Great Britain | June 17, 1941 |

OTHER REFERENCES

Article by Offner, Rev. Sci. Inst., Jan. 1937, pp. 20–21. (Copy in 179–171–8, Div. 69.)